(12) United States Patent
Kim

(10) Patent No.: US 7,626,265 B2
(45) Date of Patent: Dec. 1, 2009

(54) SEMICONDUCTOR PACKAGE HAVING FLEXIBLE LEAD CONNECTION PLATE FOR ELECTRICALLY CONNECTING BASE AND CHIP

(75) Inventor: Sang-uk Kim, Cheonan-si (KR)

(73) Assignee: Samsung Electronics Co., Ltd., Suwon-si, Gyeeonggi-do (KR)

( * ) Notice: Subject to any disclaimer, the term of this patent is extended or adjusted under 35 U.S.C. 154(b) by 85 days.

(21) Appl. No.: 11/748,577

(22) Filed: May 15, 2007

(65) Prior Publication Data
US 2008/0036063 A1 Feb. 14, 2008

(30) Foreign Application Priority Data
Aug. 8, 2006 (KR) .................. 10-2006-0074655

(51) Int. Cl.
*H01L 29/40* (2006.01)
(52) U.S. Cl. ..................... 257/750; 257/787
(58) Field of Classification Search ........ 257/787, 257/666, 750, 676, 668, 77, 686
See application file for complete search history.

(56) References Cited

U.S. PATENT DOCUMENTS 6,230,399 B1 * 5/2001 Maheshwari et al. .......... 29/840

FOREIGN PATENT DOCUMENTS

| KR | 1020010076477 A | 8/2001 |
| KR | 1020010107535 A | 12/2001 |
| KR | 2002-237553 | 8/2002 |
| KR | 1020030078373 A | 5/2007 |

* cited by examiner

*Primary Examiner*—Roy K Potter
(74) *Attorney, Agent, or Firm*—Volentine & Whitt, PLLC

(57) ABSTRACT

A semiconductor package has a base, a chip attached to the base, a flexible connection plate mounted on and electrically connecting the chip and the base, and an encapsulant encapsulating the chip and the flexible connection plate on the base. The flexible connection plate includes a film and a layer of leads integrated with the film. Inner ends of the leads located at a central portion of the flexible connection plate are connected to contact pads of the chip, and outer ends of the leads located at an outer peripheral portion of the flexible connection plate are connected to leads of the base.

24 Claims, 17 Drawing Sheets

SEMICONDUCTOR PACKAGE HAVING FLEXIBLE LEAD CONNECTION PLATE FOR ELECTRICALLY CONNECTING BASE AND CHIP

BACKGROUND OF THE INVENTION

1. Field of the Invention

The present invention relates to semiconductor devices. More particularly, the present invention relates to a semiconductor package in which a chip is mounted on and is electrically connected to a base of the package.

2. Description of the Related Art

In the manufacturing of a semiconductor package, a chip is often electrically connected to its bases e.g., a printed circuit board (PCB) or a lead frame, by bonding wires to the chip and base. However, many problems occur in the wires, especially when the semiconductor package is relatively thin and compact. For example, shorts often occur in the wires because the pitch of contact pads to which the wires are bonded is relatively small. Also, electrical interference can occur between radio frequency electrical signals transmitted through the wires. In particularly sensitive devices, the electrical interference can manifest itself as an undesirable phenomenon known as cross-talk.

Furthermore, in known types of semiconductor packages in which a plurality of chips are stacked one atop the other, such as a system-in-package (SIP) or a multi-chip module (MCP), a spacer must be interposed between the chips to provide a sufficient amount of clearance for all of the bonding wires. However, such a spacer undesirably adds to the thickness of the semiconductor package.

SUMMARY OF THE INVENTION

An object of the present invention is to provide a semiconductor package that is free of the problems that occur when using bonding wires to electrically conductively interconnect a chip and a base of the package such as a lead frame or PCB.

For instance, an object of the present invention is to provide a semiconductor package that will not experience short circuits between the chip and the base. Another object of the present invention is to provide a semiconductor package in which electrical signals are transmitted between the chip and the base without interfering with one another.

Another object of the present invention is to provide a relatively thin semiconductor package, especially of a chip stack type in which several chips are stacked on one another.

According to one aspect of the present invention, there is provided a semiconductor package having a chip, a base (e.g., a printed circuit board (PCB) or a lead frame) on which the chip is mounted, and a flexible connection plate disposed on the chip and electrically connecting the chip and the base. The flexible connection plate is ductile, and includes a film and a layer of electrical leads integral with the film. For example, the flexible connection plate is a flexible copper clad lamination (FCCL). The base may have a trench in which the chip is situated. The semiconductor package also has an encapsulant encapsulating the chip and the flexible connection plate on the base.

The leads of the flexible connection plate have inner ends at a central portion of the flexible connection plate and outer ends at an outer peripheral portion of the flexible connection plate. The inner ends of the leads are connected to external electrical contacts of the chip. For example, solder bumps are used to connect contact pads of the chip and the inner ends of the leads of the flexible connection plate. The outer ends of the leads are connected to electrical leads of the base. For example, an anisotropic conductive film or solder bumps connect the outer ends of the leads of the flexible connection plate and the electrical leads of the base.

The central portion of the flexible connection plate may have an opening extending therethrough with the opening being located over the chip. Also, the flexible connection plate may have a plurality of connection parts extending radially from the central portion. The connection parts include intermediate sections of the leads of the flexible connection plate. Also, at least one of connection parts of the flexible connection plate may have an opening therethrough to facilitate the molding process used to form the encapsulant and/or to accommodate a passive electronic device or the like.

In addition, wires may be employed to connect some contacts of the chip to selected leads of the base. In this case, the wire bonding process used to attach the wires can be carried out after the flexible connection plate is mounted on the chip. Thus, the design of the layout of the wires and the implementation of the wire bonding process has a relatively high degree of freedom.

According to another aspect of the present invention, there is provided a semiconductor package comprising a base, a first chip attached to the base, a first flexible connection plate disposed on and electrically connecting the first chip and the base, a second chip disposed on the first chip, a second flexible connection plate disposed on and electrically connecting the second chip and the base, and an encapsulant encapsulating the first chip, the second chip, the first flexible connection plate, and the second flexible connection plate on the base.

The first flexible connection plate and the second flexible connection plate each include a film and a layer of leads integral with the film. The leads of each flexible connection plate have inner ends located at a central portion of the respective plate and outer ends located at an outer peripheral portion of the respective plate. The inner ends of the first flexible connection plate are connected to contacts of the first chip, and the inner ends of the second flexible connection plate are connected to contacts of the second chip. The outer ends of the leads of each of the flexible connection plates are connected to leads of the base.

Also, a first layer of adhesive may be interposed between the first flexible connection plate and the base such that the first flexible connection plate and the base are adhered to one another by the first layer of adhesive. A second layer of adhesive may be interposed between the second flexible connection plate and the first flexible connection plate such that the first flexible connection plate and the second flexible connection plate are adhered to one another by the second layer of adhesive.

In addition, wires may be employed to connect some of the contacts of the second chip to selected leads of the base. In this case, the wire bonding process used to attach the wires can be carried out after the second flexible connection plate is mounted on the second chip.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
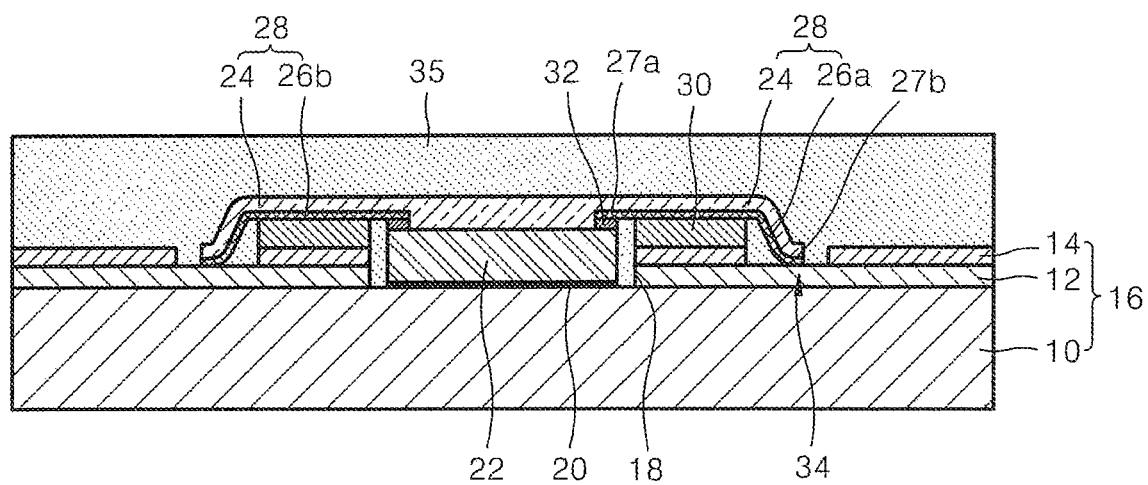
FIG. 1 is a sectional view of a first embodiment of a semiconductor package according to the present invention.

Semiconductor packages according to the present invention will be described in more detail below with reference to the accompanying drawings. In the drawings, the thicknesses of layers and the relative sizes of features may be exaggerated for clarity. Furthermore, like reference numerals generally designate like elements throughout the drawings.

A first embodiment of a semiconductor package according to the present invention will now be described in detail with reference to FIG. 1. The semiconductor package has a base 16. The base 16 may be a printed circuit board (PCB) or a lead frame. In the illustrated embodiment, the base 16 is a PCB including a substrate 10, and an interconnection (wiring) layer 12 printed on the substrate 10 and an insulating layer 14 disposed the substrate 10 over the interconnection (wiring) layer 12. The central portion of the base 16 has trench 18. The trench 18 is formed by etching the layers that constitute the insulating layer 14 and the interconnection layer 12.

A chip 22 is adhered to the base 16 within the trench 18 by a first adhesive layer 20. The first adhesive layer 20 may be an adhesive film. The adhesive film may be part of that attached to the bottom surface of a semiconductor wafer, as will be described in more detail later on. The positioning of the chip 22 in the trench 18 helps to minimize the thickness of the semiconductor package.

A flexible connection plate 28 is disposed on the chip 22 and the base 16. Preferably, the flexible connection plate 28 is ductile, i.e., has a relatively large plastic deformation range. For example, the flexible connection plate 28 may be an FCCL (flexible copper clad lamination). More specifically, the flexible connection plate 28 may comprise a polyimide base film 24 clad with a copper layer of leads 26 (refer to FIG. 7). In the sectional view of FIG. 1, a first set of the leads 26a is shown as disposed at one side of the chip 22, and a second set of the leads 26b is shown as disposed at the other side of the chip 22. Hereinafter, reference will be made merely to the leads 26 of the flexible connection plate 28.

The leads 26 electrically connect the chip 22 to the interconnection (wiring) layer 12 of the base 16. More specifically, inner ends 27a of the leads 26 are bonded to contact pads 32 of the chip 22 so as to be electrically connected to the chip 22. Similarly, outer ends 27b of the leads 26 are bonded to leads 34 of the interconnection (wiring) layer 12 of the base 16 so as to be electrically connected to the base 16. The outer ends 27b of the leads 26 may be bonded to the leads 34 of the interconnection (wiring) layer 12 of the base 16 using an anisotropic electrically conductive film or solder bumps, as will be explained in more detail later. Also, as shown in FIG. 1, the outer ends 27b of the leads 26 are bent to facilitate their connection to the leads 34 of the interconnection (wiring) layer 12.

The semiconductor package also has a second adhesive layer 30 interposed between the layer of leads 26 of the flexible connection plate 28 and the base 16 of the semiconductor package. The second adhesive layer 30 thus bonds the flexible connection plate 28 to the base 16 of the semiconductor package. The second adhesive layer 30 may be an adhesive film attached to the layer of leads 26. Finally, the semiconductor package also has an encapsulant 35 that encapsulates the chip 22 and the flexible connection plate 28 on the base 16 so as to protect the semiconductor chip 22 from the external environment. The encapsulant 35 is, for example, an epoxy molding compound.

Figure 2:
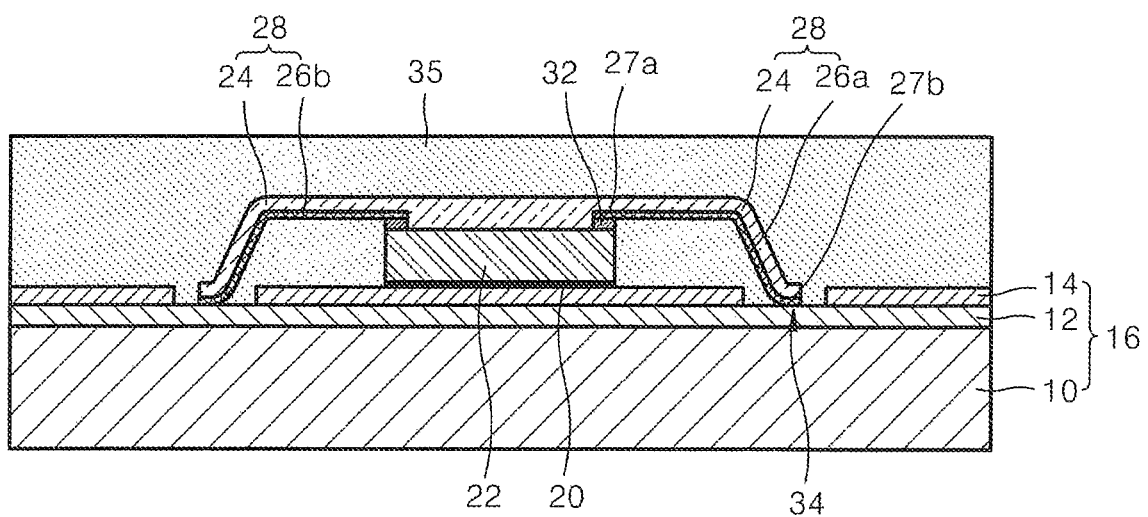
FIG. 2 is a sectional view of another embodiment of a semiconductor package according to the present invention.

FIG. 2 illustrates another embodiment of a semiconductor package according to the present invention. The semiconductor package of the embodiment of FIG. 2 is the same as that of the embodiment illustrated in FIG. 1 with the following exceptions. First, the base 16 does not have a trench in which the chip 22 is mounted. Instead, the chip 22 is bonded to the insulating layer 14 of the base 16. That is, the manufacturing of the embodiment of FIG. 2 omits the process of etching the insulating layer 14 and interconnection (wiring) layer 12 to form the trench 18 in the base 16, as in the embodiment of FIG. 1. Secondly, the semiconductor package of the second embodiment does not have a discrete adhesive layer adhering the bottom surface of the layer of leads 26 to the base 16. That is, the flexible connection plate 28 is mounted to the base 16 without separately bonding the intermediate portion of the flexible connection plate 28 directly to the base 16.

Figure 3:
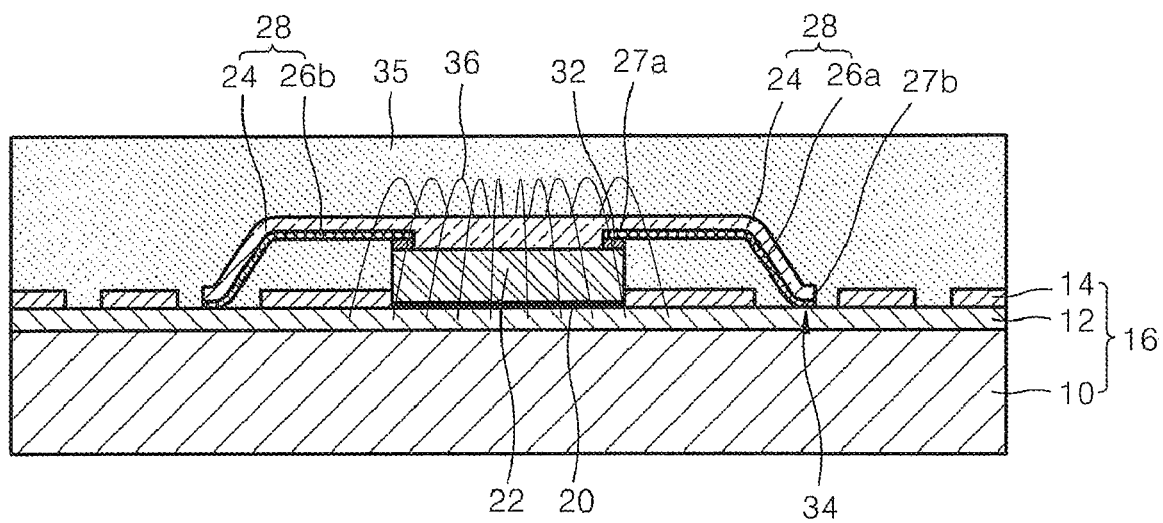
FIG. 3 is a sectional view of yet another embodiment of a semiconductor package according to the present invention.

FIG. 3 illustrates a third embodiment of a semiconductor package according to the present invention. The semiconductor package of the embodiment of FIG. 3 is the same as those of the embodiments illustrated in FIGS. 1 and 2 with the following exceptions. First, in the embodiment of FIG. 3, the base 16 has a trench in which the chip 22 is disposed but the trench extends in only the insulating layer 14 of the base 16. Alternatively, the trench can be omitted in its entirety. Secondly, in the embodiment of FIG. 3, the chip 22 and the base 16 are wire bonded after they are connected by the flexible connection plate 28.

More specifically, wires 36 are respectively bonded to contact pads of the chip 22, which are not connected to the inner ends 27*a* of the leads 26. The wires 36 are also bonded to leads 34 of the interconnection (wiring) layer 12 of the base 16, respectively. The wires 36 are used to transmit relatively high voltage or high speed signals between the chip 22 and the base 16. The embodiment of FIG. 3 provides a high degree of freedom in connection with the use of wire bonding because the wires 36 are used to provide only some of the electrical interconnections between the chip 22 and the base 16.

Figure 4:
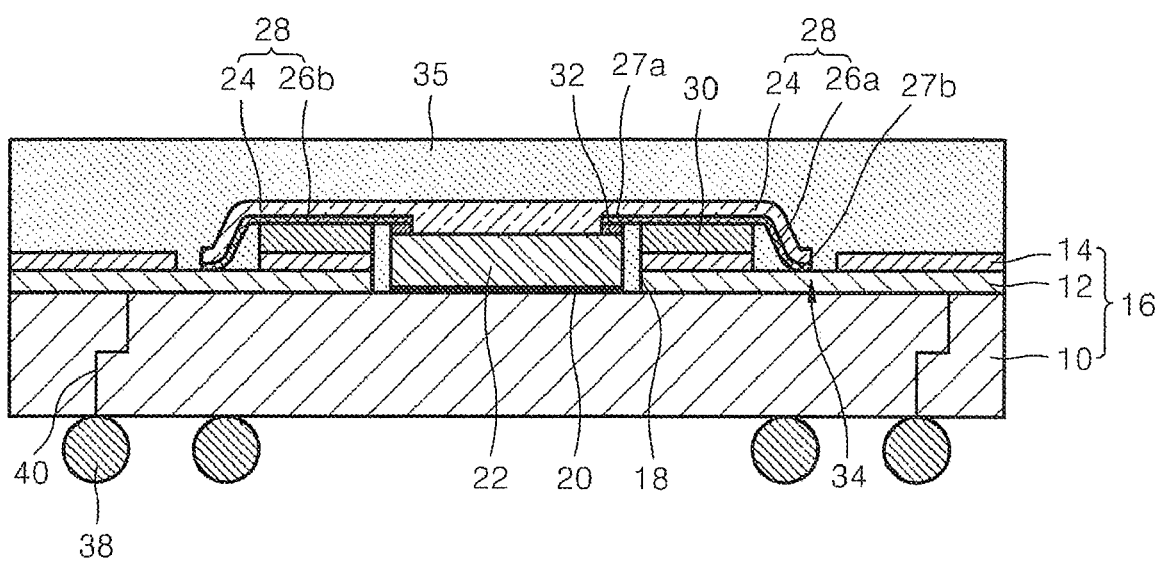
FIGS. 4 through 6 are sectional views of ball grid array (BGA) packages according to the present invention corresponding to the embodiments shown in FIGS. 1 through 3, respectively.
Figure 5:
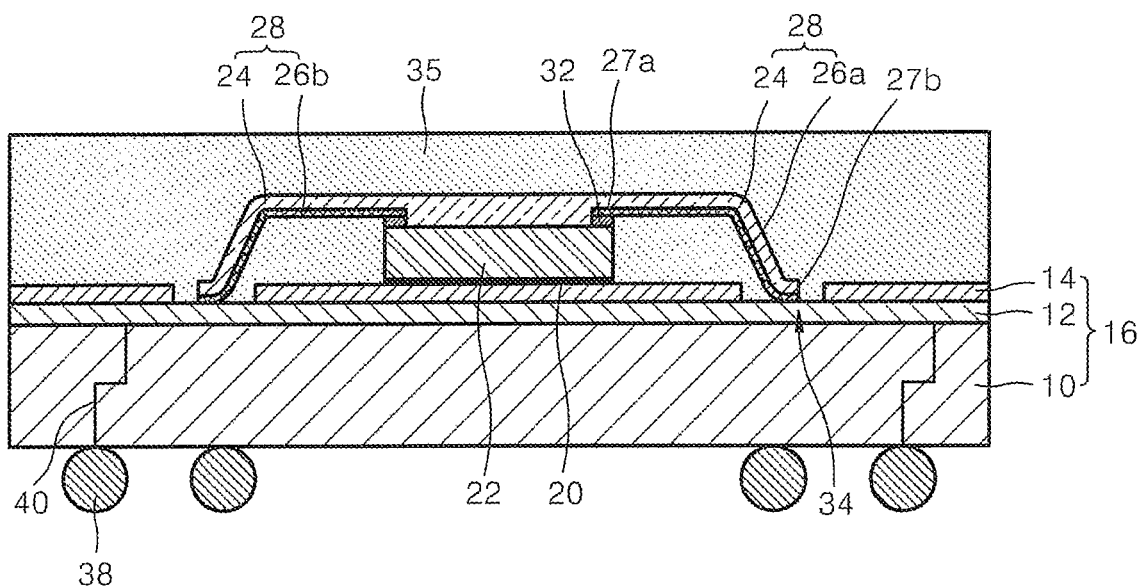
Figure 6:
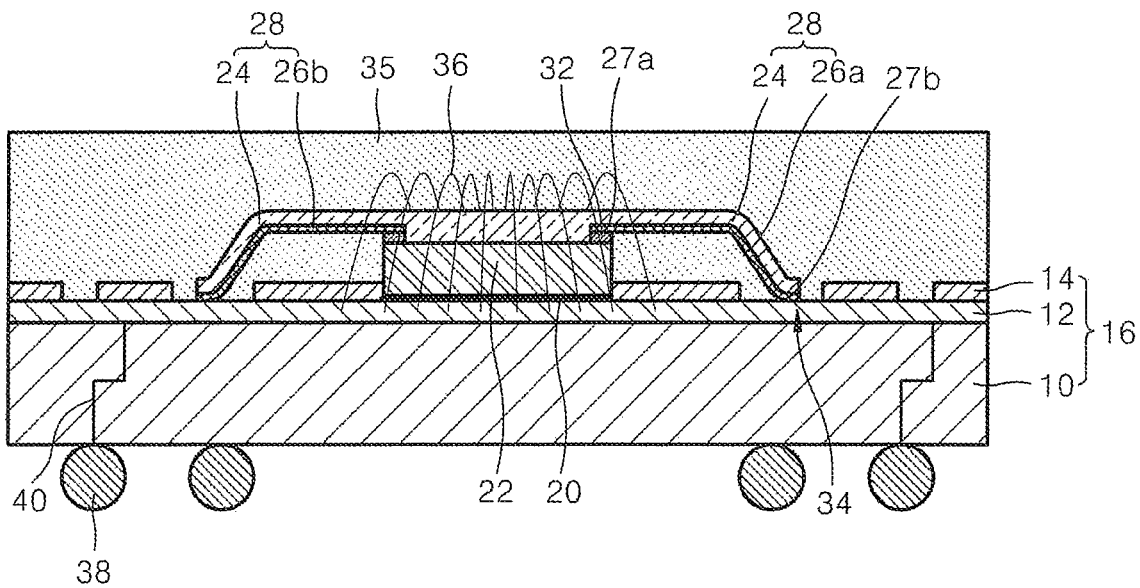

FIGS. 4 through 6 illustrate other forms of the embodiments of the semiconductor packages of FIGS. 1 through 3, respectively.

Figure 7:
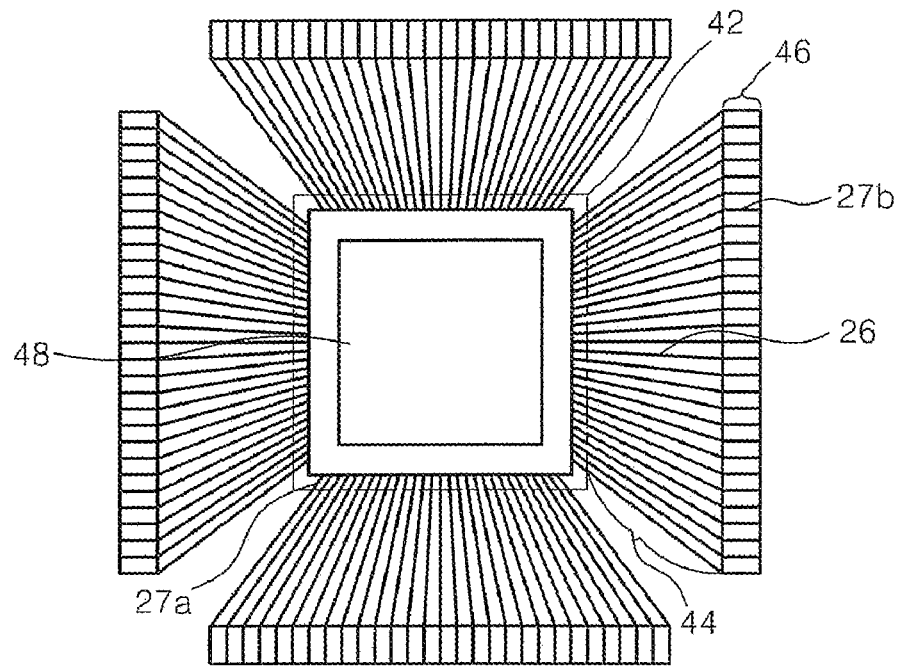
FIG. 7 is a plan view of a first type of a flexible connection plate for use in a semiconductor package according to the present invention.

In particular, each of the semiconductor packages of FIGS. 4 through 6 is ball grid array (BGA) type of semiconductor package in which solder balls 38 are disposed on the bottom surface of the base 16. The solder balls 38 are connected to an inner interconnection layer 40 inside the substrate 10. Preferably, and although not shown in these figures, a plurality of the chips 22 are stacked in each BGA type of semiconductor package FIGS. 7 through 9 illustrate in more detail flexible connection plates for use in semiconductor packages according to the present invention.

Referring to FIGS. 1-3 and 7-9, a flexible connection plate 28 for use in a semiconductor package according to the present invention has a chip mount part 42, at which the flexible connection plate 28 is mounted to a chip 22 of the package, and an outer peripheral part 46 at which the flexible connection plate 28 is attached to the base 16 as described above. More specifically, the chip mount part 42 includes the inner ends 27*a* of the leads 26, which are connected to the contact pads 32 of the chip 22 as described above in connection with FIGS. 1-3. A central portion 48 of the chip mount part 42 may have an opening extending therethrough such that the chip 22 is exposed when the flexible connection plate 28 is mounted to the chip 22. The outer peripheral part 46 includes the outer ends 27*b* of the leads 26, which are connected to the leads 34 of the interconnection (wiring) layer 12 of the base 16.

The flexible connection plate 28 also has connection parts 44 that include intermediate sections of the leads 26, i.e., sections of the leads 26 intermediate the inner ends 27*a* and the outer ends 27*b* of the leads 26. The connection parts 44 extend radially from and are spaced from each other about the chip mount part 42 of the flexible connection plate 28.

Figure 8:
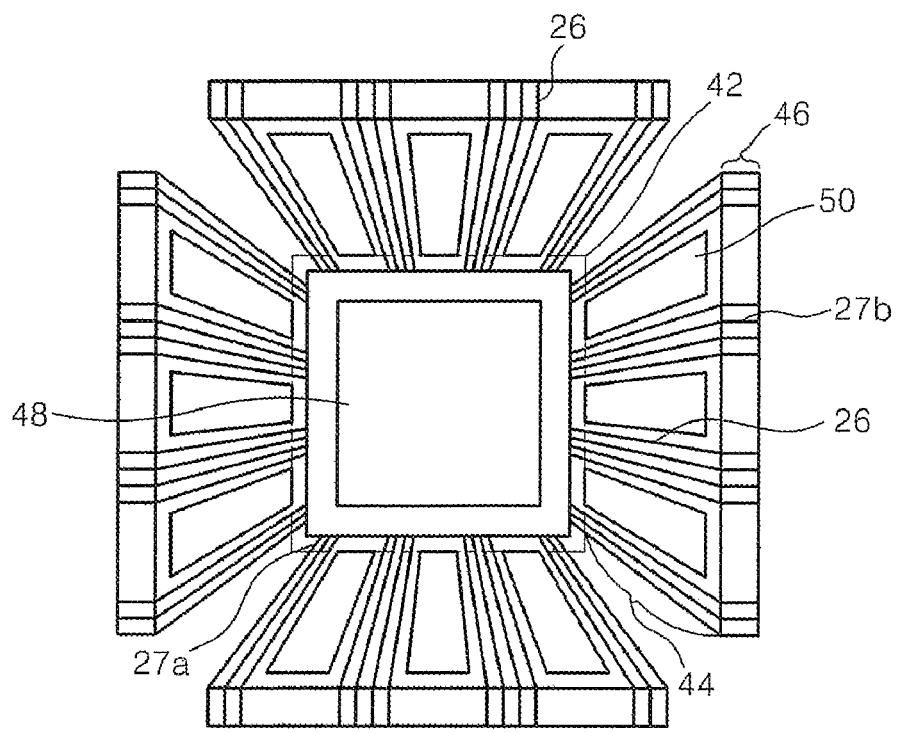
FIG. 8 is a plan view of another type of a flexible connection plate for use in a semiconductor package according to the present invention.
Figure 9:
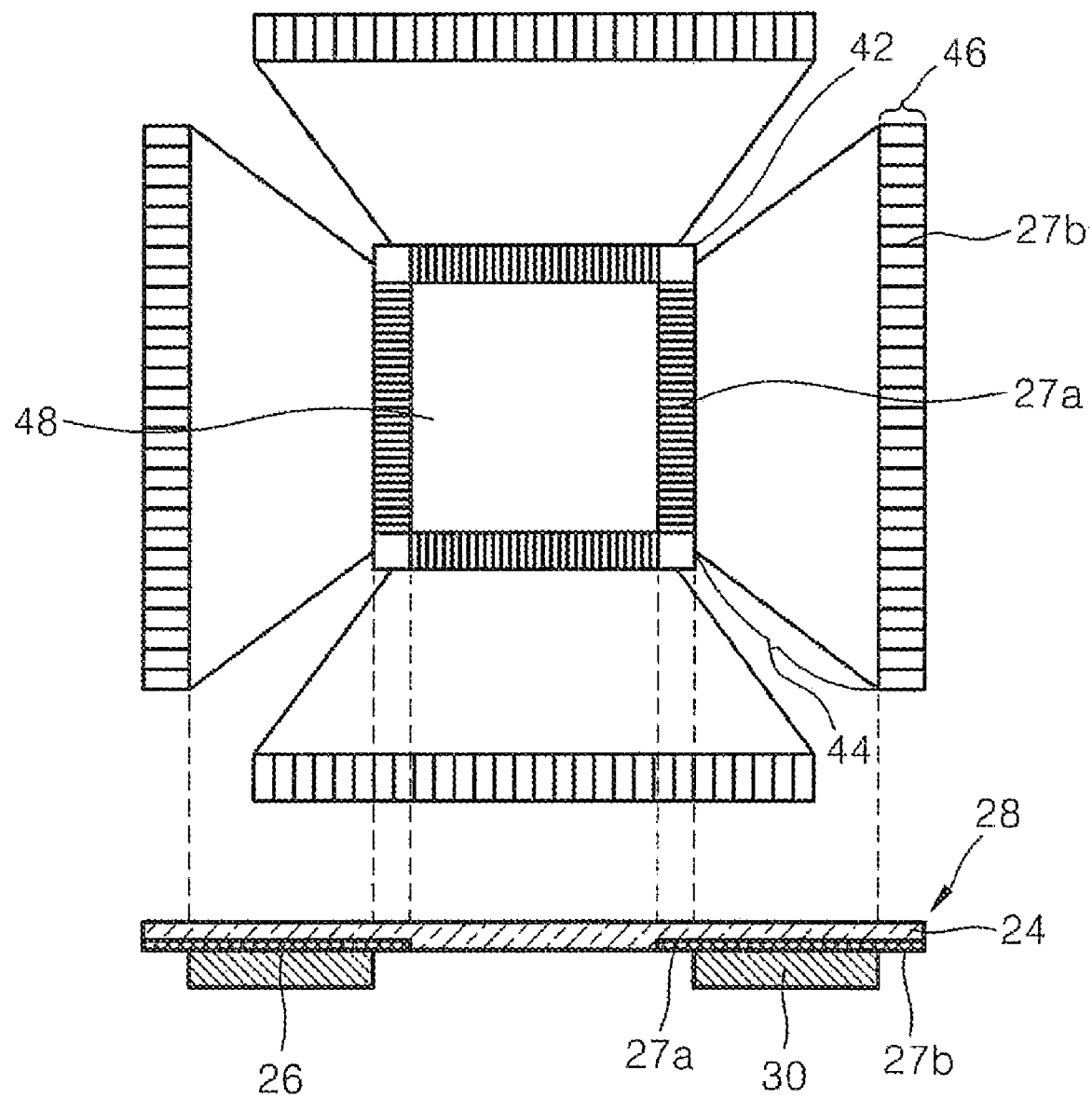
FIG. 9 is a plan and sectional view of still of a flexible connection plate and integral adhesive layer for use in a semiconductor package according to the present invention.

Furthermore, as shown in FIG. 8, the connection parts 44 may have openings 50 extending therethrough. The openings 50 expose the base 16 when the flexible connection plate 28 is mounted to the base 16. Therefore, a passive electronic device may be mounted to the base 16 beneath one of the openings 50, in which case the opening 50 can accommodate wires bonded to the passive electronic device and a chip 22. Furthermore, the openings 50 allow a molding compound to flow therethrough when encapsulating the chip 22 and the flexible connection plate 28, i.e., when the encapsulant 35 is formed.

Also, as shown in FIG. 9, the adhesive layer 30 of the semiconductor package of the type shown in FIG. 1 may be pre-formed on the layer of leads 26. In this case, the flexible connection plate 28 can be easily attached to the base 16, as will be explained later on in more detail.

Figure 10:
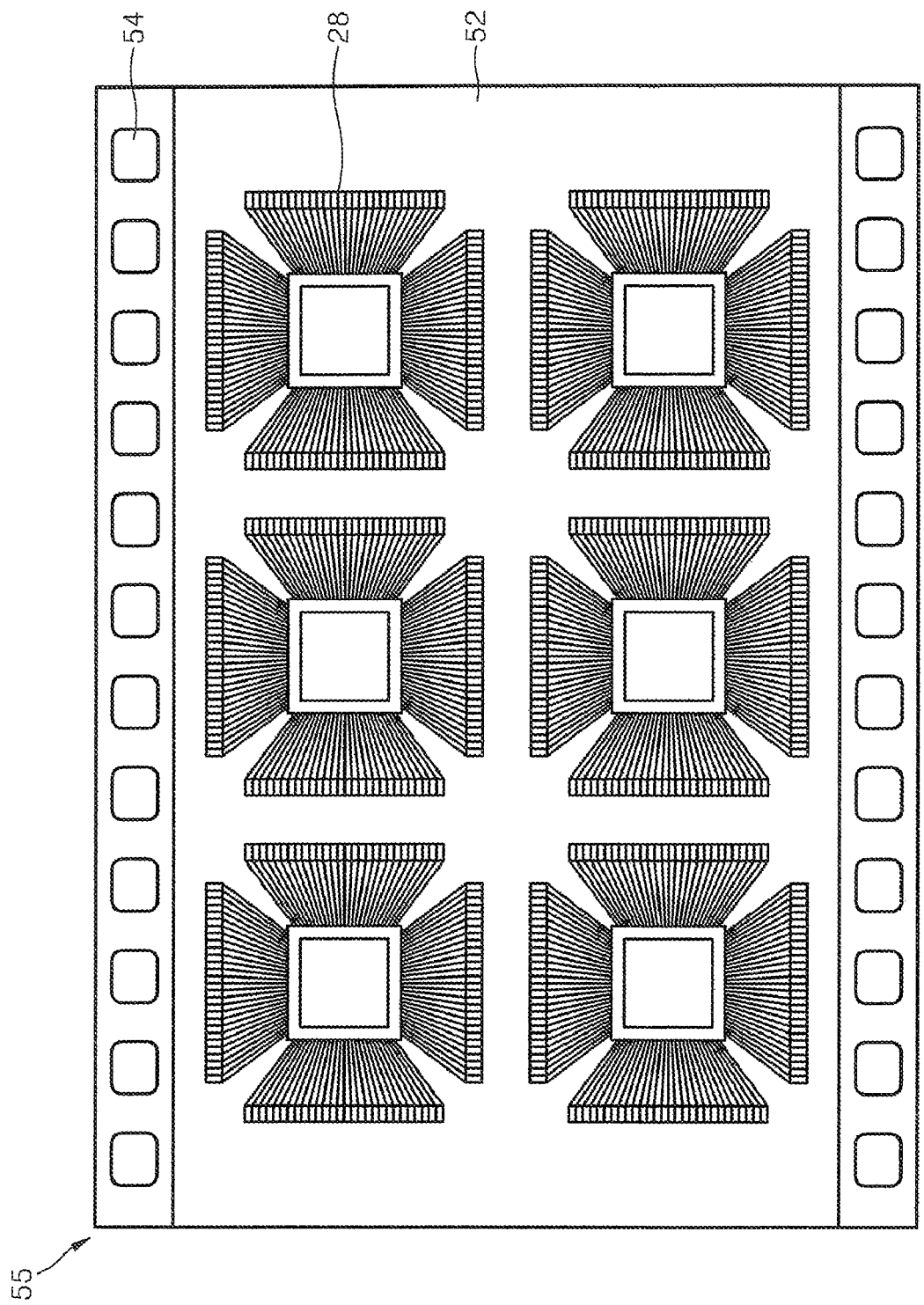
FIG. 10 is a plan view of a ribbon of flexible connection plates for use in fabricating semiconductor packages according to the present invention.
Figure 11:
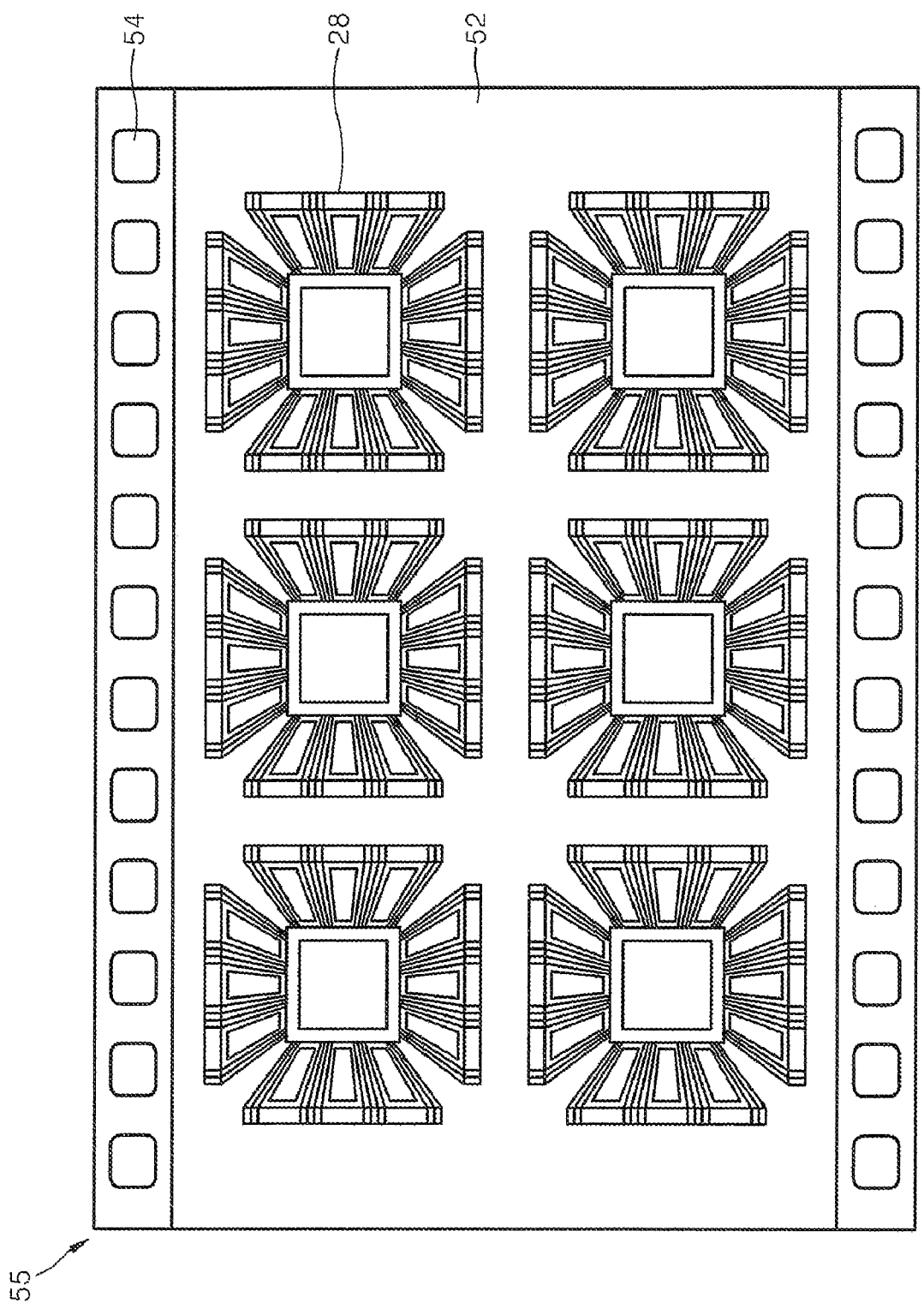
FIG. 11 is a plan view of another ribbon of flexible connection plates for use in fabricating semiconductor packages according to the present invention.

FIGS. 10 and 11 each illustrate a ribbon 55 including an array of flexible connection plates 28 for use in semiconductor package of the present invention. Each ribbon 55 has a support membrane 52 constituting the base film 28 of the flexible connection plates 28, conductive layers formed on the support membrane and constituting the layers of leads 26 of the flexible connection plates 28 and a series of sprocket holes 54 at each side of the support membrane 52. The conductive layers are formed in a plurality of rows on the support membrane 52, for example, in two rows, such that the ribbon 55 has a plurality of rows of flexible connection plates 28. The sprocket holes 54 allow each ribbon 55 to be wound around and fed by sprockets, i.e., reels.

Figure 12:
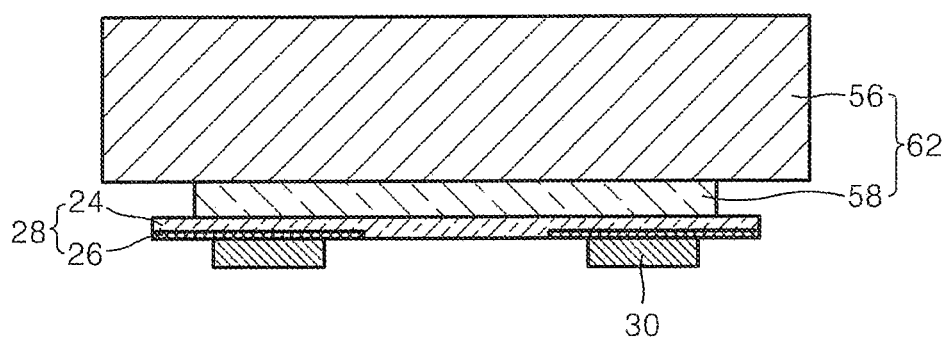
FIGS. 12 through 14 are schematic diagrams illustrating a technique of electrically connecting the flexible connection plate to a chip and base in the process of fabricating a semiconductor package of the embodiment of FIG. 1.
Figure 13:
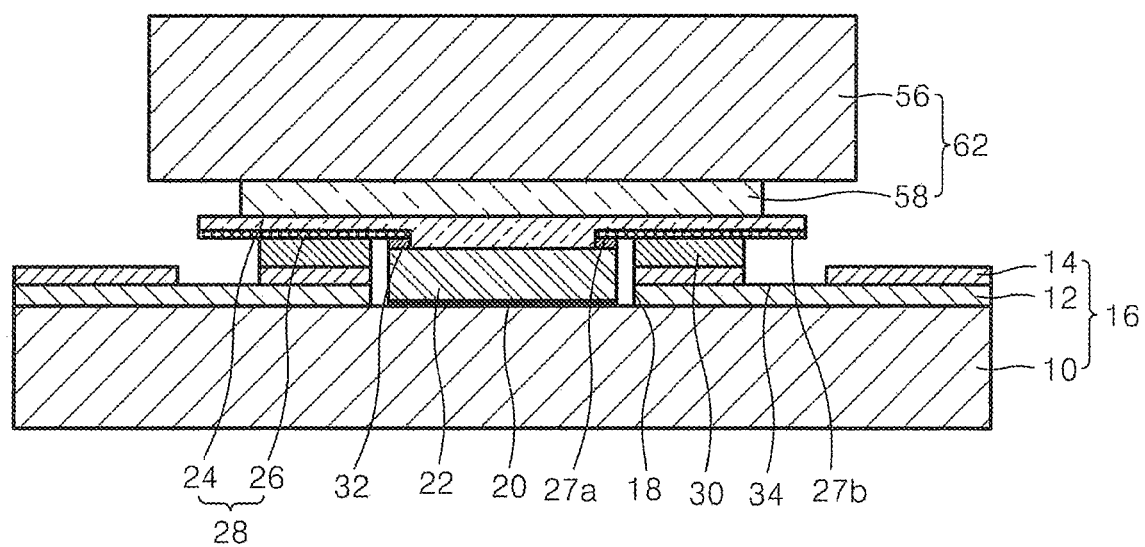
Figure 14:
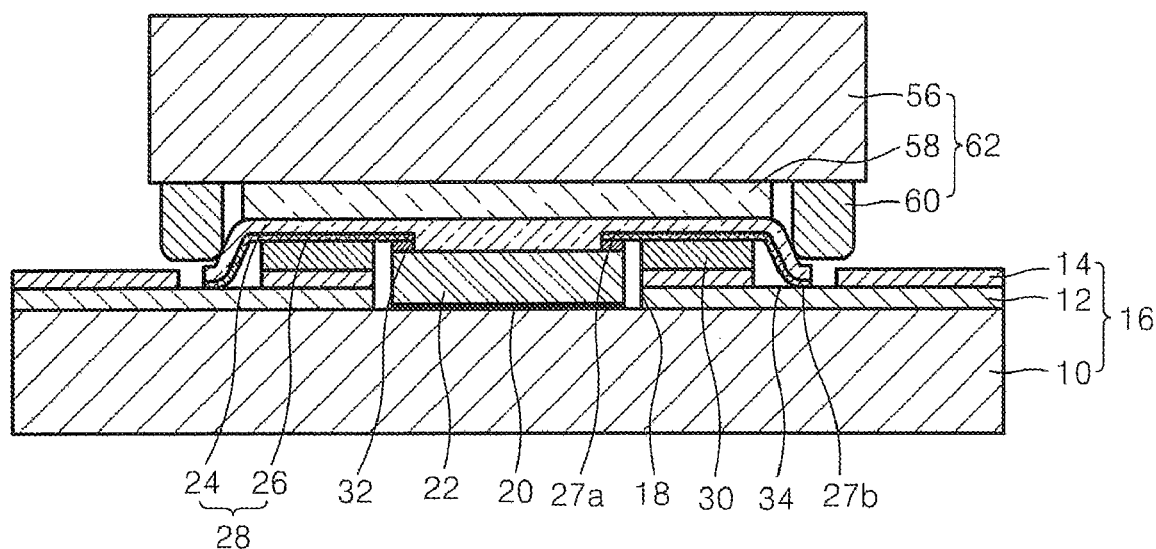

FIGS. 12 through 14 illustrate a process of bonding a flexible connection plate 28 of the type shown in FIG. 9 to a chip 22 and base 16 in fabricating the semiconductor package of FIG. 1.

First, as shown in FIG. 12, the flexible connection plate 28 is adhered to a bonding part 58 of a bonding tool 62. The bonding part 58 is disposed at the center of the bottom surface of a body 56 of the bonding tool 62. At this time, the chip 22 has already been attached to the base 16 within the trench 18 in the base, and the resultant structure is supported below the bonding tool 62.

Then, as shown in FIG. 13, the body 56 of the bonding tool 62 is moved downward so as to place the flexible connection plate 28 on the chip 22, and the adhesive layer 30 on the base 16. More specifically, the inner ends of the leads 26 are placed against the contact pads 32 of the chip 22, and the second adhesive layer 30 is placed against the insulating layer 14 of the base 16. At this time, the outer ends 27*b* of the leads 26 are disposed above leads 34 of the interconnection (wiring) layer 12 of the base 16.

Next, as shown in FIG. 14, pistons 60 of the bonding tool 62, located on opposite sides of the body 56, are extended so as to bend the outer peripheral parts of the flexible connection plate 28. As a result, the outer ends 27*b* of the leads 26 are placed against the leads 34 of the interconnection (wiring) layer 12 of the base 16.

Figure 15:
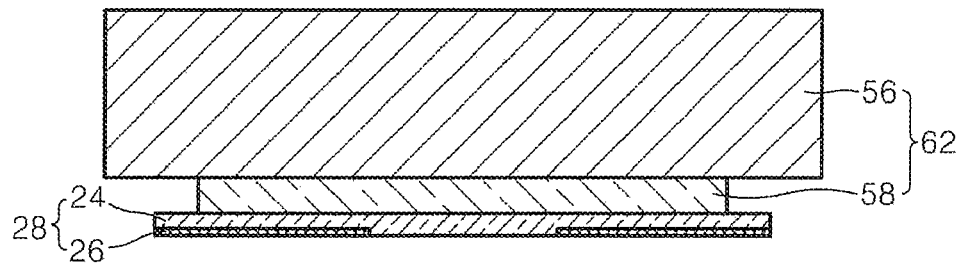
FIGS. 15 through 17 are schematic diagrams illustrating a technique of electrically connecting the flexible connection plate to a chip and base in the process of fabricating a semiconductor package of the embodiment of FIG. 2.
Figure 16:
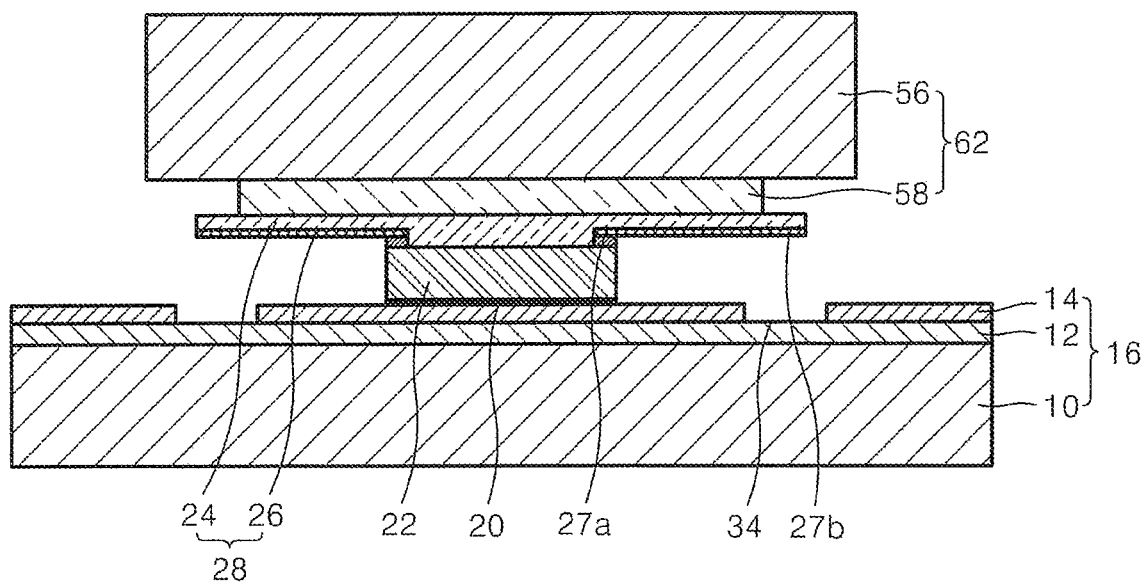
Figure 17:
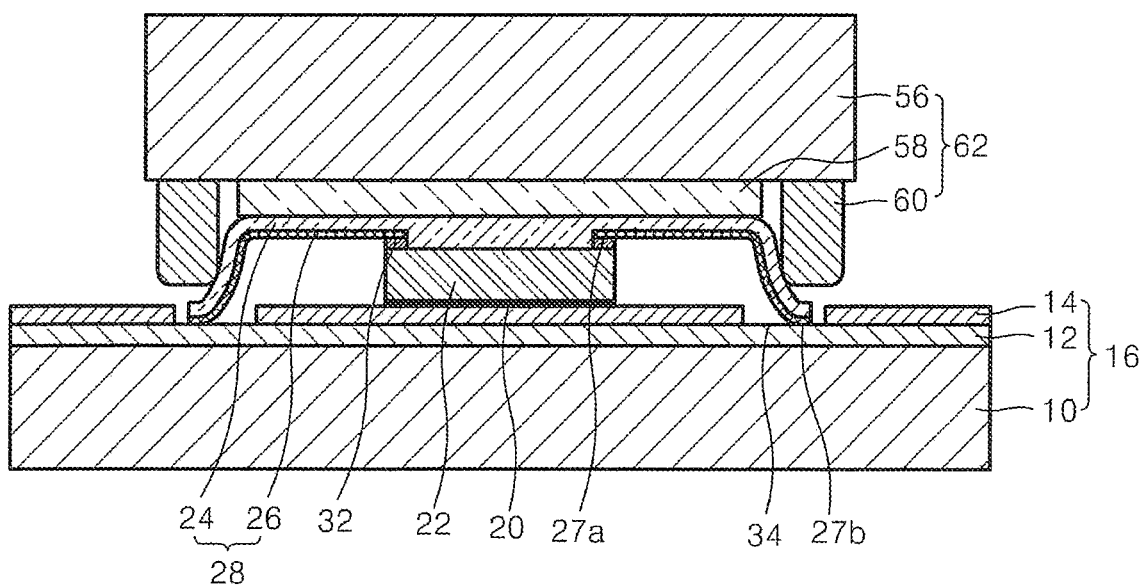

FIGS. 15 through 17 illustrate a process of bonding a flexible connection plate 28 of the type shown in FIG. 7 or FIG. 8 to a chip 22 and base 16 in fabricating the semiconductor package of FIG. 2.

First, as shown in FIG. 15, the flexible connection plate 28 is adhered to the bonding part 58 of the bonding tool 62. At this time, the chip 22 has already been attached to the insulating layer 14 of the base 16, and the resultant structure is supported below the bonding tool 62.

Then, as shown in FIG. 16, the body 56 of the bonding tool 62 is moved downward so as to place the flexible connection plate 28 on the chip 22. More specifically, the inner ends 27a of the leads 26 are placed against the contact pads 32 of the chip 22. At this time, the outer ends 27b of the leads 26 are disposed above leads 34 of the interconnection (wiring) layer 12 of the base 16.

Next, as shown in FIG. 17, the pistons 60 of the bonding tool 62 are extended fully so as to bend the outer peripheral parts of the flexible connection plate 28. As a result, the outer ends 27b of the leads 26 are placed against the leads 34 of the interconnection (wiring) layer 12 of the base 16.

Figure 18:
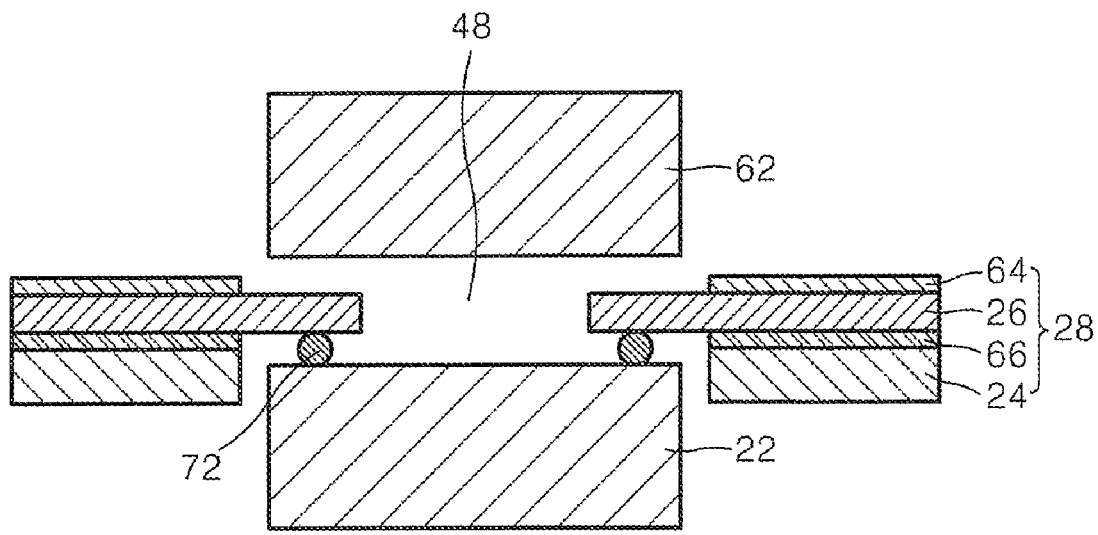
FIG. 18 is a schematic diagram illustrating a technique of electrically connecting a flexible connection plate and a chip in the process of fabricating a semiconductor package according to the present invention.
Figure 19:
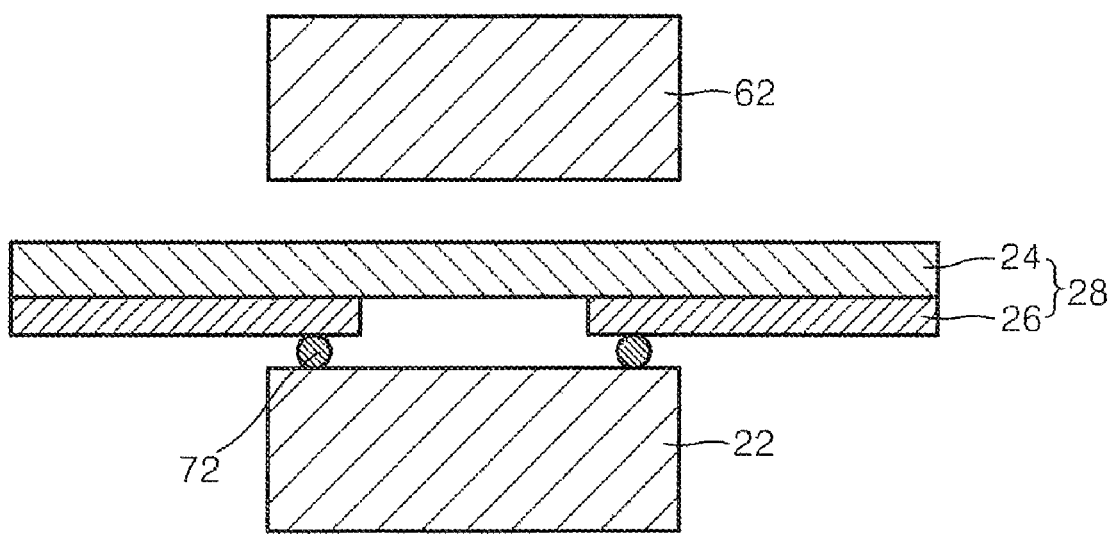
FIG. 19 is a schematic diagram illustrating a technique of electrically connecting another type of flexible connection plate and a chip in the process of fabricating a semiconductor package according to the present invention.

FIGS. 18 and 19 each illustrate a process of electrically connecting (bonding) a flexible connection plate and a chip in the manufacturing of a semiconductor package according to the present invention.

More specifically, the flexible connection plate 28 of FIG. 18 is characterized in that the layer of leads 26 is attached to the base film 24 by an adhesive layer 66, an opening 48 extends through the central portion of the flexible connection plate 28 to expose the chip 22, and a protective layer 64 is disposed on the layer of leads 26. The flexible connection plate 28 of FIG. 19 merely comprises a layer of leads 26 printed on a base film 24. In the processes illustrated in FIGS. 18 and 19, the flexible connection plate 28 and the chip 22 are electrically connected by solder bumps 72 using the bonding tool 62 illustrated in and described with respect to FIGS. 12 through 17. That is, the solder bumps 72 constitute external electrical contacts of the chip 22. The solder bumps 72 are formed on contact pads (not shown) of the chip 22. The bonding tool 62 is lowered to press the inner ends of the leads 26 against the solder balls 72, thereby flattening the solder balls 72 and electrically connecting the flexible connection plate 28 to the chip 22.

Figure 20:
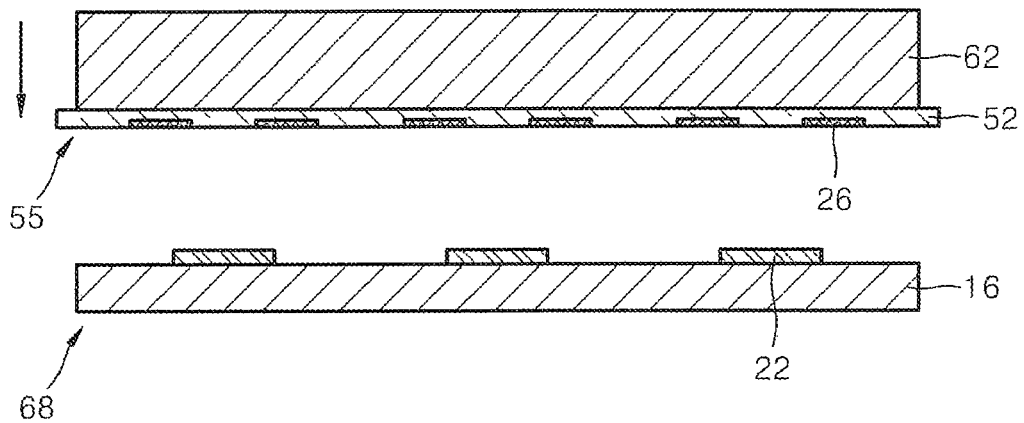
FIGS. 20 through 22 are schematic diagrams illustrating a technique of bonding an array of flexible connection plates to a base in fabricating semiconductor packages according to the present invention.
Figure 21:
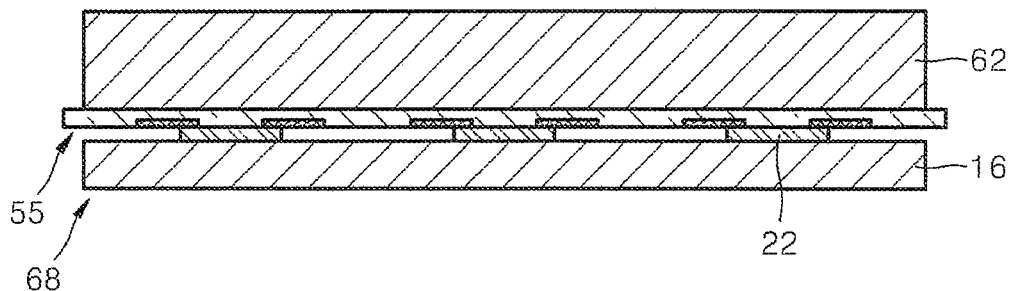
Figure 22:
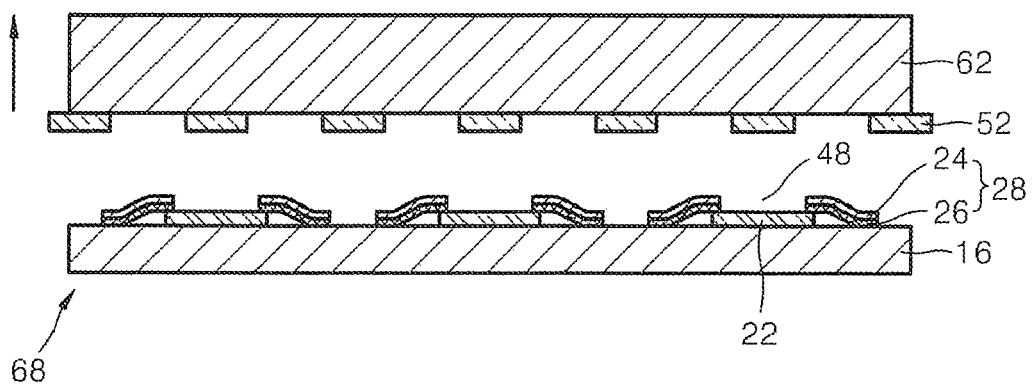

FIGS. 20 through 22 illustrate a process of bonding an array of flexible connection plates to a base and an array of chips in the manufacturing of semiconductor packages according to the present invention. The process illustrated in FIGS. 20 through 22 employs a ribbon 55 of the flexible connection plates 28 of the type shown and described above in connection with FIG. 10 or 11, and a bonding tool 62 of the type shown and described above in connection with FIGS. 12 through 17. Furthermore, the process employs a substrate array 68 comprising a base 16, and a plurality of rows of chips 22 bonded to the base 16.

Referring to FIG. 20, the ribbon 55 comprising an array of flexible connection plates is attached to a bonding tool 62. Also, the substrate array 68 is supported such that the chips 22 are vertically aligned with flexible connection plates 28 of the ribbon 55, respectively. Then, the bonding tool 62 is lowered.

Referring to FIG. 21, the bonding tool 62 is moved downwardly to press the flexible connection plates of the ribbon 55 against the chips 22 of the substrate array 68. Specifically, similar to the process illustrated in FIG. 13 or FIG. 16, the inner ends of the leads 26 of the flexible connection plates of the ribbon 55 are pressed against external contacts of the chips 22, respectively. The contacts may be solder balls as shown and described above in connection with FIGS. 18 and 19. Next, as described above in connection with FIG. 14 or FIG. 17, pistons of the bonding tool 62 are extended. In this case, the pistons perforate the ribbon 55 and thereby separate the array of flexible connection plates from respective regions of the base film 52. At the same time, the pistons press the outer ends of the leads 26 of the flexible connection plates against leads of the substrate array 68, respectively. Then, as shown in FIG. 22, the bonding tool 62 is raised to leave the flexible connection plates connected to the chips 22 and substrate array 68. Also, as shown in FIG. 22, the ribbon 55 can perforated such that the base film 52 is removed from central portions of the flexible connection plates when the bonding tool 62 is raised. As a result, openings 48 are formed in the flexible connection plates to expose the chips 22.

Figure 23:
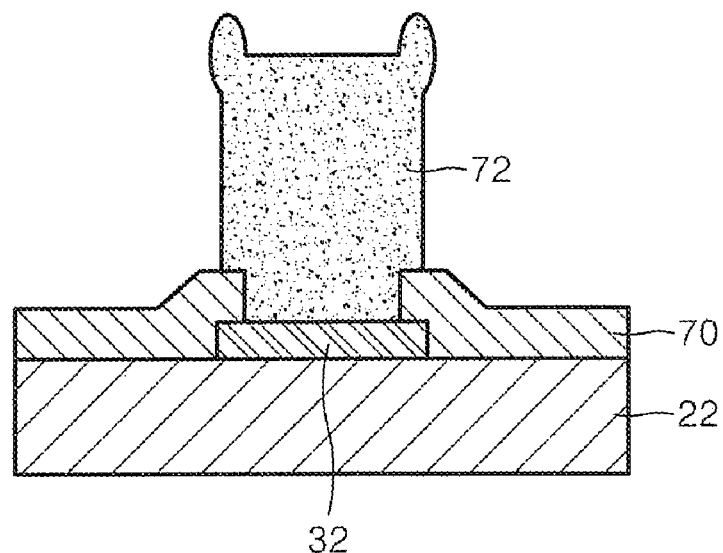
FIG. 23 is a sectional view of a solder bump and contact pad of a chip to be connected to a lead of a flexible connection plate in a semiconductor package according to the present invention.

FIG. 23 illustrates a portion of a chip 22 having another type of external contact which may be used in a semiconductor package of the present invention. In this case, the external contact is a solder bump 72. More specifically, a plurality of chip contact pads 32 are provided at an upper portion of the chip 22. An insulating layer 70 is also provided at the upper portion of the chip 22 to insulate the chip pads 32 from each other. A respective solder bump 72 is disposed on each chip pad 32. The inner ends of leads of a flexible connection plate are connected to the solder bumps 72 in fabricating a semiconductor package according to the present invention. Alternatively, wires may be connected to some of the solder bumps, in the manner described above in connection with FIG. 3.

Figure 24:
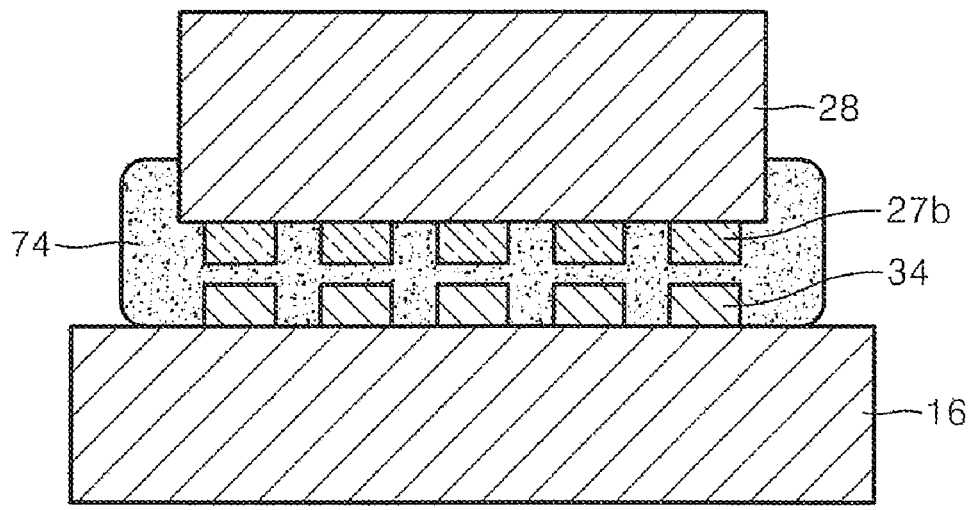
FIG. 24 is a sectional view of part of a semiconductor package according to the present invention in which an anisotropic film electrically conductively connects leads of a flexible connection plate to those of the base in the semiconductor package.
Figure 25:
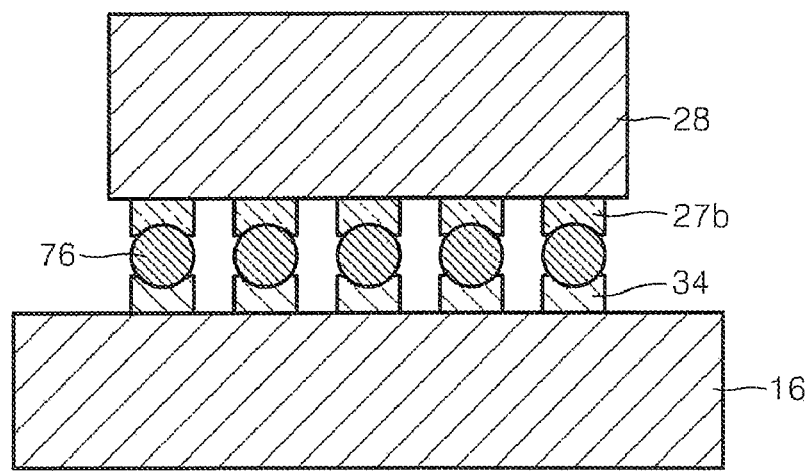
FIG. 25 is a sectional view of part of a semiconductor package according to the present invention in which solder bumps electrically conductively connect leads of a flexible connection plate to those of the base in the semiconductor package.

FIGS. 24 and 25 each illustrate the bonding of a flexible connection plate to a base in the fabricating of a semiconductor package according to the present invention. Referring to FIG. 24, an anisotropic conductive film 74 is interposed between the outer ends 27b of the leads of the flexible connection plate 28 and the leads 34 of the base 16 to facilitate an electrically conductive connection between the chip and the base 22. Alternatively, as illustrated in FIG. 25, solder bumps 76 may be interposed between the outer ends 27b of the leads of the flexible connection plate 28 and the leads 34 of the base 16.

Next, stacked chip packages according to the present invention will be described with reference to FIGS. 26 through 31. Such a stacked chip package according to the present invention may employ any of the features described above in connection with the single chip packages. Furthermore, such a stacked chip package may be fabricated according to the present invention using the same processes and bonding tool described above.

Figure 26:
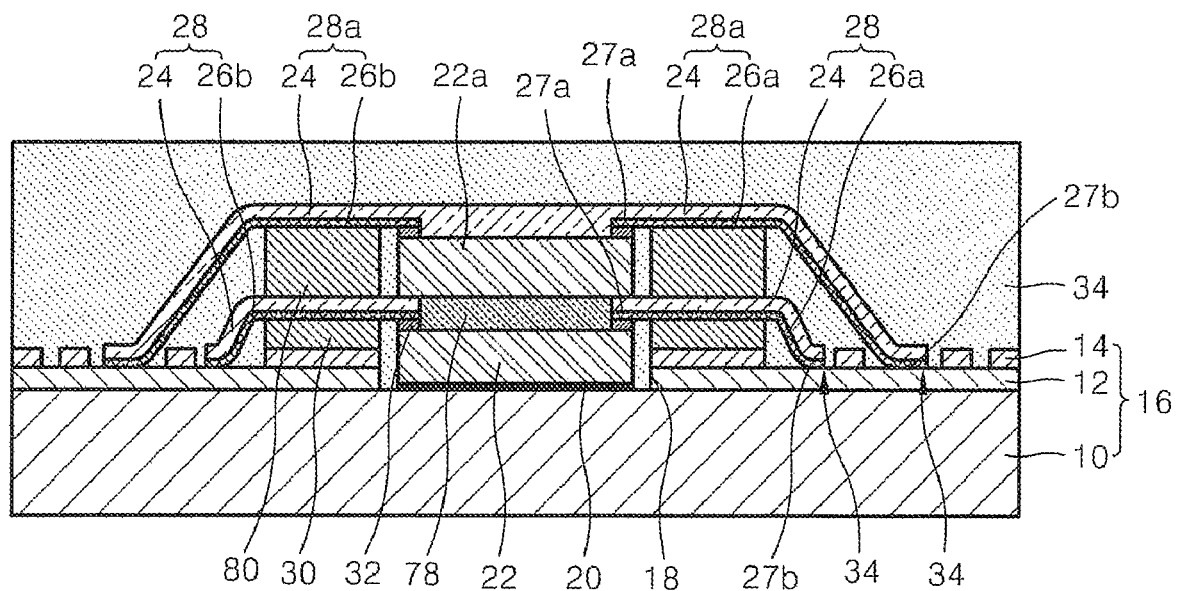
FIG. 26 is a sectional view of an embodiment of a chip stack type of semiconductor package according to the present invention.

FIG. 26 illustrates a first embodiment of a stacked chip semiconductor package according to the present invention. The stacked chip semiconductor package is substantially the same as the semiconductor package of the embodiment of FIG. 1 except that a second chip 22a is stacked on the first chip 22, and a second flexible connection plate 28a electrically interconnects the second chip 22a and the base 16. Also, the first chip 22 is electrically connected to the base 16 by a first flexible connection plate 28 having an opening extending through the central portion thereof so that the first chip 22 is exposed by the first flexible connection plate 28. The second chip 22a is attached to the first chip 22 by a third adhesive layer 78 provided in the opening in the center of the first flexible connection plate 28. The second flexible connection plate 28a and the first flexible connection plate 28 are attached by a fourth adhesive layer 80. Furthermore, in the embodiment of FIG. 26, the outer ends 27b of the leads 26a and 26b of the second flexible connection plate 28a are electrically connected to an interconnection (wiring) layer 12 of the base 16 at locations that are disposed radially outwardly of the locations at which the outer ends 27b of the leads 26a and 26b of the first flexible connection plate 28 are electrically connected to the interconnection (wiring) layer 12.

Figure 27:
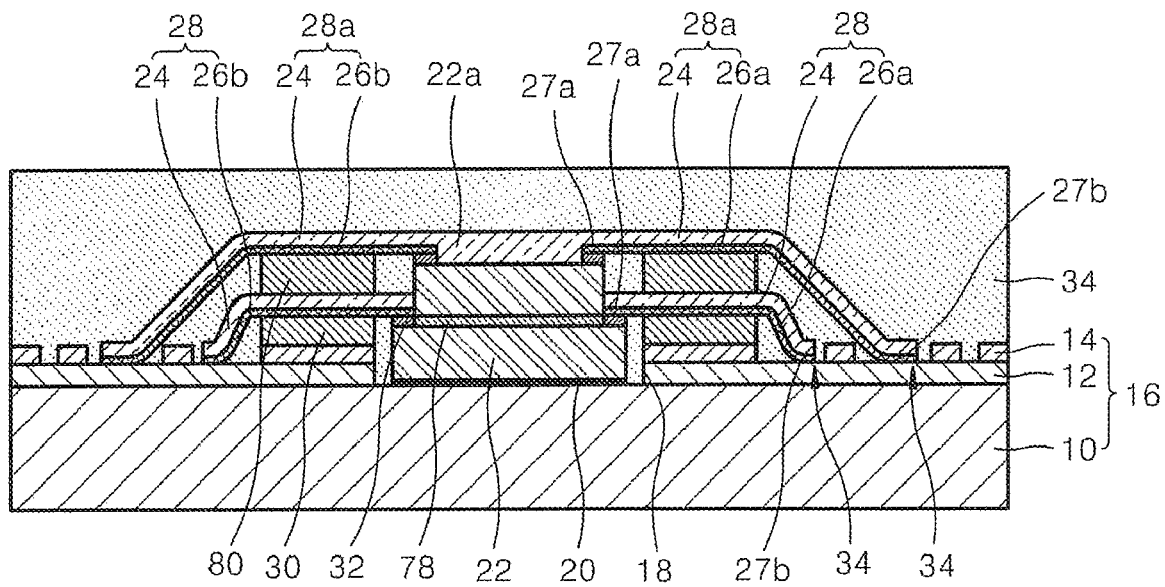
FIG. 27 is a sectional view of a variation of the chip stack type of semiconductor package shown in FIG. 26 according to the present invention.

FIG. 27 shows a similar embodiment in which the size of the second chip 22a is different from that of the first chip 22. Thus, according to the present invention as described above, the second chip 22a can be easily stacked on the first chip 22 without regard to the size of the second chip 22a.

Figure 28:
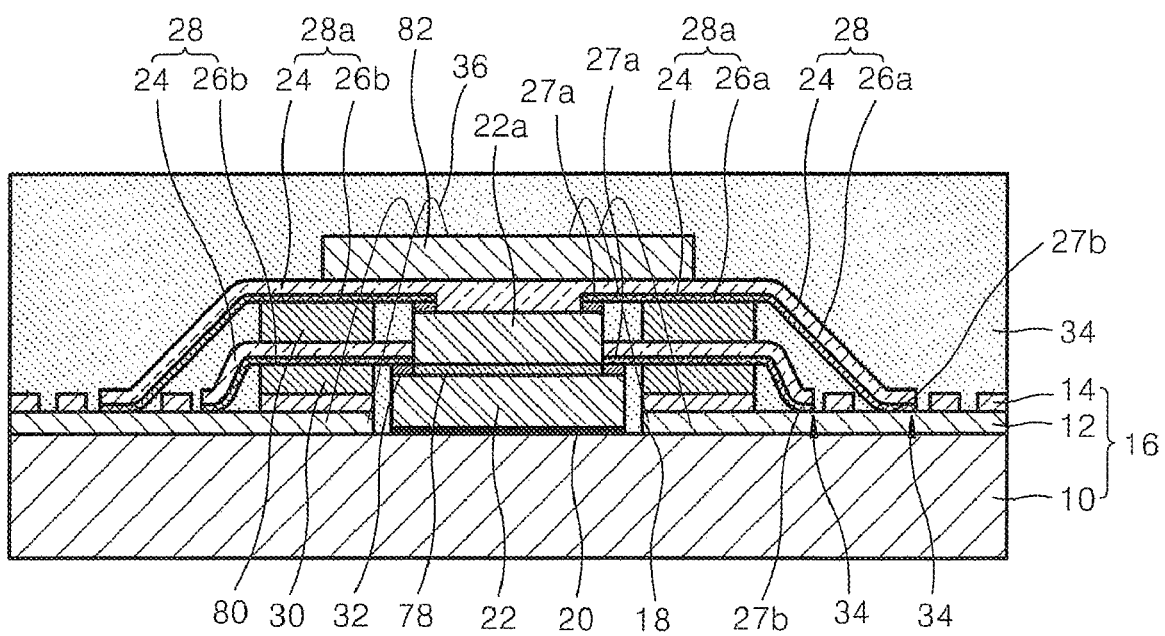
FIG. 28 is a sectional view of another embodiment of a chip stack type of semiconductor package according to the present invention.

FIG. 28 illustrates another embodiment of a stacked chip semiconductor package according to the present invention. This embodiment is the same as that illustrated in FIG. 27 except that the second chip 22a and the base 16 are also connected by wires 36. Also, although FIG. 28 illustrates an embodiment in which the second chip 22a is smaller than that of the first chip 22, the first chip 22 and the second chip 22a can have the same size as in the embodiment of FIG. 26.

Also, in the embodiment of FIG. 28, a stack member 82 is disposed on the second flexible connection plate 28a. The stack member 82 is used to provide clearance by which the wires 36 can be more easily connected to respective external contacts, e.g. contact pads, of the second chip 22a. Therefore, the stack member 82 may be omitted when the wire bonding process can be easily performed after the second flexible connection plate 28a is attached to the second chip 22 and base 16. As was described above in connection with the embodiment of FIG. 6, the wires 36 may be used for transmitting high voltage or high speed signals.

Figure 29:
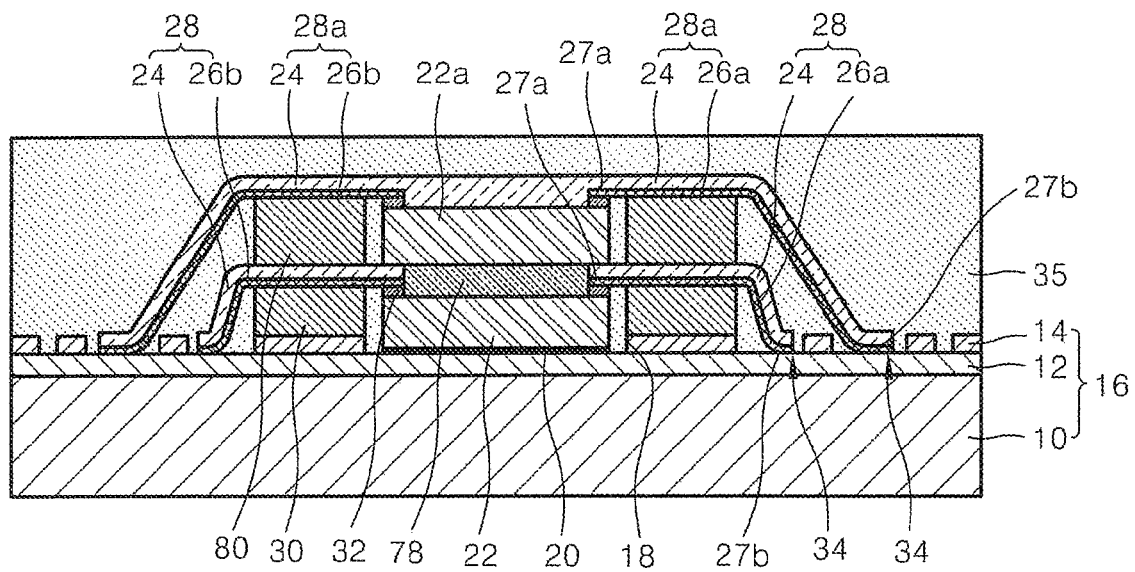
FIG. 29 is a sectional view of still another embodiment of a chip stack type of semiconductor package according to the present invention.
Figure 30:
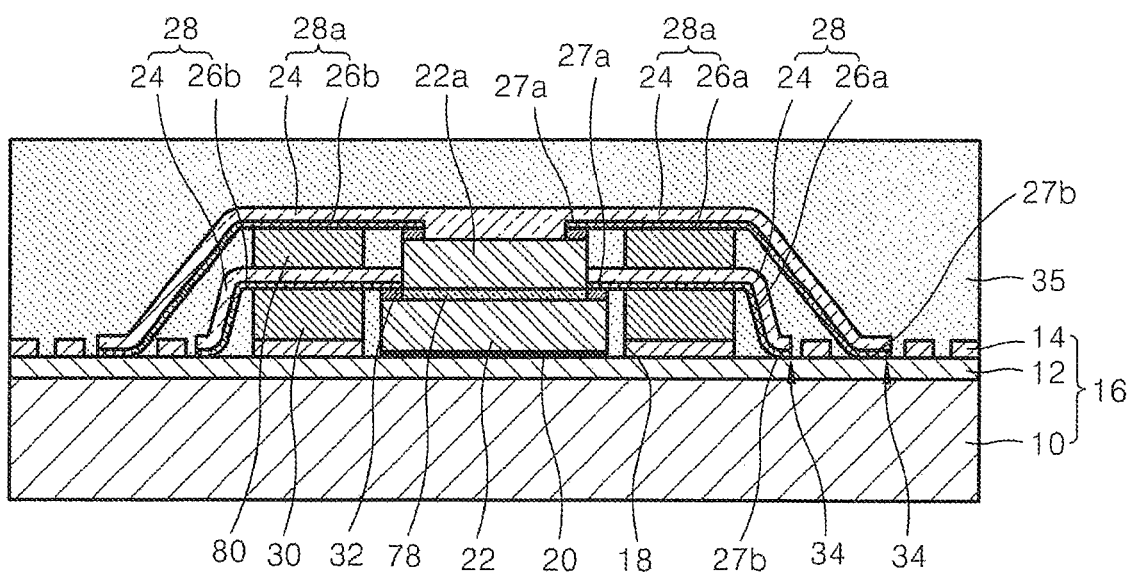
FIG. 30 is a sectional view of a variation of the chip stack type of semiconductor package shown in FIG. 29 according to the present invention.

FIGS. 29 and 30 illustrate other embodiments of stacked chip semiconductor packages according to the present invention. These semiconductor packages are the same as the semiconductor packages illustrated in FIGS. 26 and 27, except that the first chip 22 is mounted on the insulating layer 14 of the base 16 instead of directly on the substrate 10 of the base 16 via a trench that extends through the interconnection (wiring) layer 12. Of course, the first chip 22 of a stacked chip semiconductor package according to the present invention could also be mounted directly on the insulating layer 14, as in the embodiment of FIG. 2.

Figure 31:
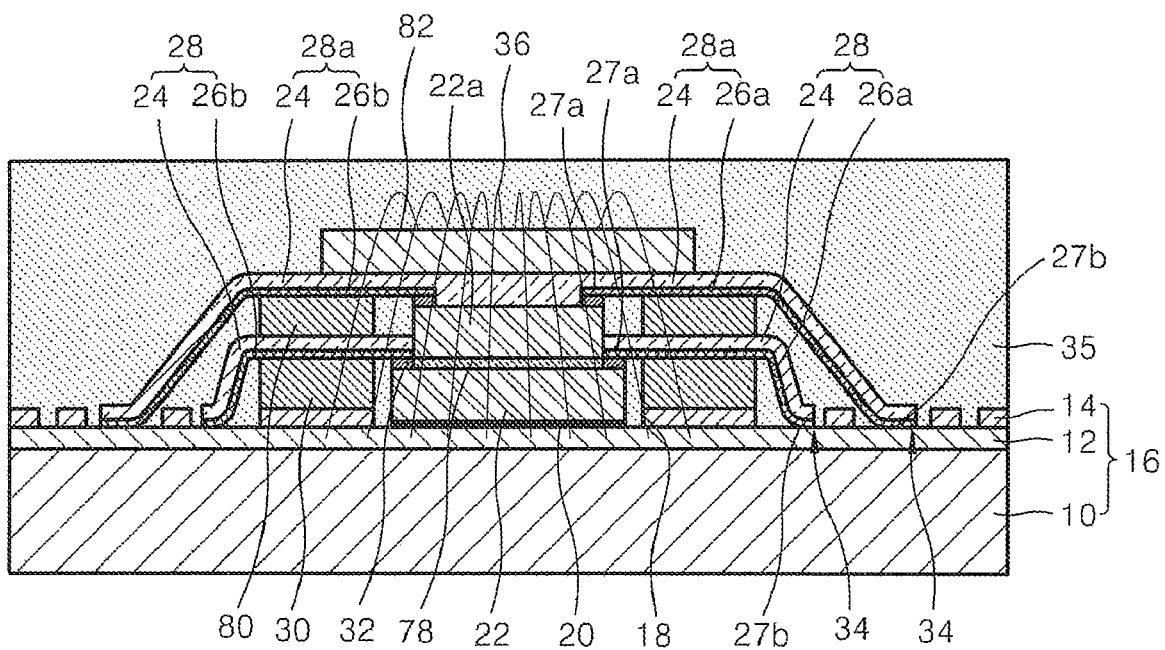
FIG. 31 is a sectional view of still another embodiment of a chip stack type of semiconductor package according to the present invention.

FIG. 31 illustrates yet another embodiment of a stacked chip semiconductor package according to the present invention. This semiconductor package is the same as that illustrated in FIG. 30 except that the second chip 22a and the base 16 are also electrically connected by wires 36. Of course, the embodiment of FIG. 31 can also be applied to the case in which the second chip 22a is the same size as the first chip 22 as in the embodiment of FIG. 29. Likewise, although the first chip 22 of the embodiment of FIG. 31 is shown as being mounted on the interconnection (wiring) layer 12 of the base 16, the first chip 22 may be mounted directly on the insulating layer 14 of the base 16 or on the substrate 10 of the base 16 via a trench that extends through the interconnection (wiring) layer.

According to the present invention as described above, the base of the package and the chip are electrically connected using a flexible connection plate having a layer of leads integral with a base film. Therefore, the leads will not create short circuits, and electrical signals transmitted through the leads will not create interference.

Furthermore, wire bonding may be selectively employed to connect only some of the contacts of the chip with the leads of the base. Therefore, a semiconductor package according to the present invention provides a high degree of freedom with regard to wire bonding.

Also, a chip stack type of semiconductor package, such as a system in package (SIP) or a multilayer chip module (MCP), can be readily realized according to the present invention due to the use of the flexible connection plates in connection with each of the chips. Moreover, a thin chip stack type of semiconductor package, can be realized according to the present invention because the semiconductor package does not require the use of an insertion member between the chips Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A semiconductor package comprising:
   a base having electrical leads;
   a chip mounted to the base, the chip having external electrical contacts;
   a flexible connection plate mounted on the chip and the base, the flexible connection plate including a film and a layer of leads integral with film, the leads of the flexible connection plate having inner ends at a central portion of the flexible connection plate and outer ends at an outer peripheral portion of the flexible connection plate, the inner ends of the leads being connected to respective ones of the external electrical contacts of the chip, and the outer ends of the leads being connected to respective ones of the electrical leads of the base, whereby the flexible connection plate electrically conductively connects the chip to the base; and
   an encapsulant encapsulating the chip and the flexible connection plate on the base,
   wherein the flexible connection plate is a flexible copper clad lamination.

2. A semiconductor package comprising:
   a base having electrical leads;
   a chip mounted to the base, the chip having external electrical contacts;
   a flexible connection plate mounted on the chip and the base, the flexible connection plate including a film and a layer of leads integral with film, the leads of the flexible connection plate having inner ends at a central portion of the flexible connection plate and outer ends at an outer peripheral portion of the flexible connection plate, the inner ends of the leads being connected to respective ones of the external electrical contacts of the chip, and the outer ends of the leads being connected to respective ones of the electrical leads of the base, whereby the flexible connection plate electrically conductively connects the chip to the base; and
   wherein the chip has contact pads, and the external electrical contacts of the chip are solder bumps disposed on respective ones of the contact pads, the solder bumps being interposed between and electrically conductively connecting the contact pads of the chip and the inner ends of the leads of the flexible connection plate.

3. The semiconductor package of claim 2, further comprising an adhesive layer interposed between the flexible connection plate and the base to one another so as to adhere the flexible connection plate and the base to one another.

4. The semiconductor package of claim 2, wherein the outer ends of the leads of the flexible connection plate are bent.

5. The semiconductor package of claim 2, wherein the base has a trench in which the chip is situated.

6. The semiconductor package of claim 2, wherein the external electrical contacts of the chip comprise contact pads, and further comprising discrete wires interconnecting respective ones of the contact pads of the chip and respective ones of the electrical leads of the base.

7. The semiconductor package of claim 2, further comprising anisotropic conductive film or solder bumps interposed between and electrically conductively connecting the outer ends of the leads of the flexible connection plate to the leads of the base.

8. The semiconductor package of claim 2, wherein the base is a printed circuit board (PCB) having a front and a back, the PCB comprising a substrate and a wiring layer printed on the substrate at the front of the PCB, and the chip being mounted on the front of the PCB, and further comprising an array of solder balls disposed on the back of the PCB, the solder balls being electrically conductively connected to the wiring layer of the PCB.

9. The semiconductor package of claim 2, wherein a central portion of the flexible connection plate has an opening extending therethrough, the opening being located over the chip.

10. The semiconductor package of claim 2, wherein the flexible connection plate has a central portion encompassing the inner ends of the leads, and connection parts disposed about the central portion as spaced from one another so as to each extend radially from the central portion, the connection parts of the flexible connection plate each having intermediate sections of the leads, the intermediate sections extending between the inner and outer ends of the leads, respectively.

11. The semiconductor package of claim 10, wherein at least one of the connection parts of the flexible connection plate has an opening extending therethrough.

12. The semiconductor package of claim 2, wherein the flexible connection plate is a flexible copper clad lamination.

13. A semiconductor package comprising:
a base having electrical leads;
a chip mounted to the base, the chip having external electrical contacts;
a flexible connection plate mounted on the chip and the base, the flexible connection plate including a film and a layer of leads integral with film, the leads of the flexible connection plate having inner ends at a central portion of the flexible connection plate and outer ends at an outer peripheral portion of the flexible connection plate, the inner ends of the leads being connected to respective ones of the external electrical contacts of the chip, and the outer ends of the leads being connected to respective ones of the electrical leads of the base, whereby the flexible connection plate electrically conductively connects the chip to the base; and
wherein the flexible connection plate is a flexible copper clad lamination.

14. The semiconductor package of claim 13, further comprising an adhesive layer interposed between the flexible connection plate and the base to one another so as to adhere the flexible connection plate and the base to one another.

15. The semiconductor package of claim 13, wherein the outer ends of the leads of the flexible connection plate are bent.

16. The semiconductor package of claim 13, wherein the base has a trench in which the chip is situated.

17. The semiconductor package of claim 13, wherein the external electrical contacts of the chip comprise contact pads, and further comprising discrete wires interconnecting respective ones of the contact pads of the chip and respective ones of the electrical leads of the base.

18. The semiconductor package of claim 13, further comprising anisotropic conductive film or solder bumps interposed between and electrically conductively connecting the outer ends of the leads of the flexible connection plate to the leads of the base.

19. The semiconductor package of claim 13, wherein the base is a printed circuit board (PCB) having a front and a back, the PCB comprising a substrate and a wiring layer printed on the substrate at the front of the PCB, and the chip being mounted on the front of the PCB, and further comprising an array of solder balls disposed on the back of the PCB, the solder balls being electrically conductively connected to the wiring layer of the PCB.

20. The semiconductor package of claim 13, wherein a central portion of the flexible connection plate has an opening extending therethrough, the opening being located over the chip.

21. The semiconductor package of claim 13, wherein the flexible connection plate has a central portion encompassing the inner ends of the leads, and connection parts disposed about the central portion as spaced from one another so as to each extend radially from the central portion, the connection parts of the flexible connection plate each having intermediate sections of the leads, the intermediate sections extending between the inner and outer ends of the leads, respectively.

22. The semiconductor package of claim 13, wherein at least one of the connection parts of the flexible connection plate has an opening extending therethrough.

23. The semiconductor package of claim 13, wherein the chip has contact pads, and the external electrical contacts of the chip are solder bumps disposed on respective ones of the contact pads, the solder bumps being interposed between and electrically conductively connecting the contact pads of the chip and the inner ends of the leads of the flexible connection plate.

24. A stacked semiconductor packages in which a plurality of packages are stacked,
at least one of packages comprising:
a base having electrical leads;
a chip mounted to the base, the chip having external electrical contacts;
a flexible connection plate mounted on the chip and the base, the flexible connection plate including a film and a layer of leads integral with film, the leads of the flexible connection plate having inner ends at a central portion of the flexible connection plate and outer ends at an outer peripheral portion of the flexible connection plate, the inner ends of the leads being connected to respective ones of the external electrical contacts of the chip, and the outer ends of the leads being connected to respective ones of the electrical leads of the base, whereby the flexible connection plate electrically conductively connects the chip to the base; and
wherein the chip has contact pads, and the external electrical contacts of the chip are solder bumps disposed on respective ones of the contact pads, the solder bumps being interposed between and electrically conductively connecting the contact pads of the chip and the inner ends of the leads of the flexible connection plate.

* * * * *